(12) United States Patent
Liao et al.

(10) Patent No.: US 10,878,916 B2
(45) Date of Patent: Dec. 29, 2020

(54) ERASING METHOD

(71) Applicant: Winbond Electronics Corp., Taichung (TW)

(72) Inventors: Yu-Kai Liao, Taichung (TW); Chiang-Hung Chen, Taichung (TW); Wen Hung, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/684,591

(22) Filed: Nov. 15, 2019

(65) Prior Publication Data
US 2020/0243143 A1  Jul. 30, 2020

(30) Foreign Application Priority Data

Jan. 24, 2019 (TW) .............................. 108102650 A

(51) Int. Cl.
*G11C 16/14* (2006.01)
*G11C 16/04* (2006.01)
*G11C 16/34* (2006.01)

(52) U.S. Cl.
CPC .......... *G11C 16/14* (2013.01); *G11C 16/0483* (2013.01); *G11C 16/345* (2013.01)

(58) Field of Classification Search
CPC ..................................................... G11C 16/14
See application file for complete search history.

(56) References Cited

U.S. PATENT DOCUMENTS

| 5,428,578 A | * | 6/1995 | Kaya | ....................... | G11C 16/16 |
| | | | | | 365/218 |
| 6,496,417 B1 | | 12/2002 | Shiau et al. | | |
| 2007/0189080 A1 | * | 8/2007 | Liu | ....................... | G11C 29/028 |
| | | | | | 365/185.29 |
| 2010/0226178 A1 | | 9/2010 | Nirschl et al. | | |

FOREIGN PATENT DOCUMENTS

TW  200623129  7/2006

* cited by examiner

*Primary Examiner* — Douglas King
(74) *Attorney, Agent, or Firm* — JCIPRNET

(57) ABSTRACT

An erasing method adapted for a semiconductor memory device is provided. The erasing method includes executing a pre-program process on the semiconductor memory device, executing an erase process on the semiconductor memory device, executing an over-erase verification process on a plurality of memory cells of the semiconductor memory device, detecting a total current consumption of the plurality of memory cells, determining the number of the memory cells to be executed with a soft program process according to the total current consumption, and executing the soft program process on the memory cells based on the number of the memory cells.

8 Claims, 3 Drawing Sheets

ERASING METHOD

CROSS-REFERENCE TO RELATED APPLICATION

This application claims the priority benefit of Taiwan application serial no. 108102650, filed on Jan. 24, 2019. The entirety of the above-mentioned patent application is hereby incorporated by reference herein and made a part of this specification.

BACKGROUND

Technical Field

The disclosure relates to an operating method of a semiconductor memory device, and more particularly to an erasing method adapted for a semiconductor memory device.

Description of Related Art

Generally, when an erasing program is executed in a semiconductor memory, a memory cell array area to be executed is selected first, and then a pre-program process, an erase process, an erase verification process, an over-erase verification process, a soft program process and refresh are sequentially executed. If the erase verification process verifies that at least one memory cell has not been erased successfully, the erase process is executed again; if all the memory cells have been erased successfully, the over-erase verification process is executed on all the memory cells to identify the over-erased memory cells, execute the soft program process on all the over-erased memory cells, and verify whether all the memory cells have been successfully soft-programmed. If at least one memory cell has not been successfully soft-programmed, the soft program process is executed again; if all the memory cells have been successfully soft-programmed, then all the memory cells that have not been selected to be executed with the erase process are refreshed. When all the memory cells have been refreshed, the erasing program is ended.

The time taken for executing the pre-program process and the erase process is very short, but the time taken for executing the soft program process varies depending on the rated supply voltage of the memory chip. In general, the smaller the rated supply voltage of the memory chip is, the longer the time taken for executing the soft program process will be.

In addition, temperature also has an effect on the soft program process. For example, in room-temperature operations, the time taken by the memory chip to execute the soft program process is about 100 to 200 ms. However, in low-temperature operations (at −25° C., for example), the time taken by the memory chip to execute the soft program process increases to 900 to 950 ms because the temperature drop causes the output voltage of the charge pump to drop, thereby causing the drain voltages of the memory cells to drop. The output voltage of the charge pump drops due to leakage currents generated by the memory cells executed with the soft program process and the memory cells not executed with the soft program process; the leakage currents generated are greater at a low temperature. As a result, the time taken for the soft program process increases, which greatly reduces the efficiency of the soft program process.

A general solution to the problem of the reduced efficiency of the soft program process is to enhance the capacity of the charge pump. The capacity of the charge pump is related to the active area of the pump circuit. If the capacity is to be enhanced, the active area of the pump circuit will be enlarged as well, which causes the size of the memory chip to be larger as well. This poses a dilemma in view of the current trend of miniaturization of electronic components.

Another solution to the reduced efficiency of the soft program process is to save time by using new program algorithms or new soft program algorithms. One of the methods is to reduce the current consumption by means of using a large negative bias on word lines not executed with the verification process or by means of reducing the number of the memory cells executed with the soft program process at a time. However, both of the means have to be pre-set and do not guarantee to improve the efficiency of the soft program process and to reduce the time for soft programming.

SUMMARY

The disclosure provides an erasing method adapted for a semiconductor memory device to improve the efficiency of a soft program process and to reduce the time for soft programming.

In an embodiment of the disclosure, the erasing method adapted for the semiconductor memory device includes executing a pre-program process on the semiconductor memory device, executing an erase process on the semiconductor memory device, executing an over-erase verification process on a plurality of memory cells of the semiconductor memory device, detecting a total current consumption of the plurality of memory cells, determining the number of the memory cells to be executed with a soft program process according to the total current consumption, and executing the soft program process on the memory cells based on the number of the memory cells.

Based on the above, in the erasing method provided in the embodiments of the disclosure, the number of the memory cells simultaneously executed with the soft program process can be determined according to the amount of the total current consumption, so the time for the soft program process can be saved.

In order to make the aforementioned features and advantages of the disclosure comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

In general, temperature has an effect on the soft program process. For example, a temperature drop causes the output voltage of the charge pump to drop, thereby causing the drain voltages of the memory cells to drop. The output voltage of the charge pump drops due to leakage currents generated by the memory cells executed with the soft program process and the memory cells not executed with the soft program process. As a result, the time taken for the soft program process increases, which greatly reduces the efficiency of the soft program process. When the soft program process is executed on the memory cells, both the memory cells being executed with the soft program process and the memory cells not executed with the soft program process consume currents, but the current consumed by the memory cells being executed with the soft program process is relatively greater. The greater the current consumed is, the heavier the load of the drain charge pump will be, which is why the memory chip with a low supply voltage is less efficient when executing the soft program process on the memory cells.

In an embodiment of the disclosure, the number of memory cells to be executed with a soft program process at a time is determined by detecting a total current consumption of all the memory cells, thereby improving the efficiency of the soft program process and reducing the time for soft programming.

Figure 1:
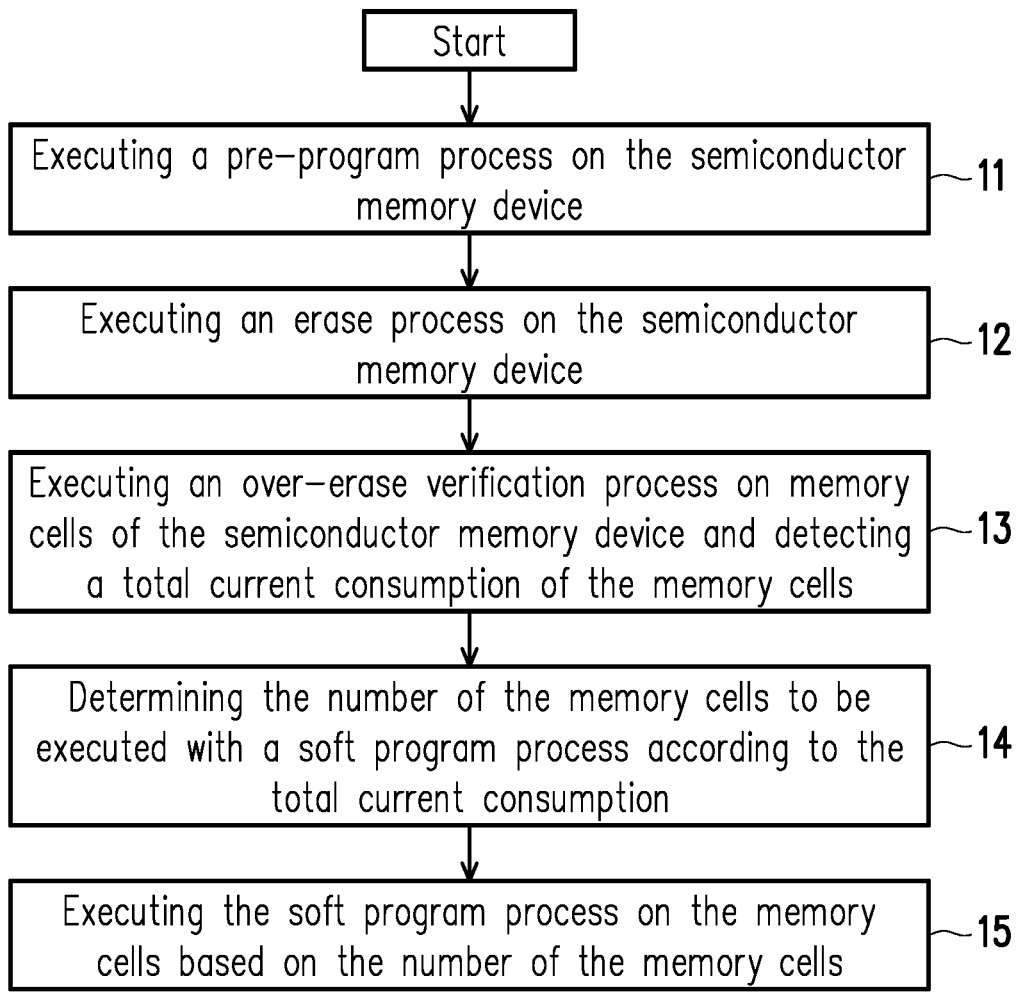
FIG. 1 is a flowchart according to an embodiment of the disclosure.

With reference to FIG. 1, the erasing method shown in FIG. 1 is adapted for a semiconductor memory device such as a NOR flash memory chip.

In Step 11, a pre-program process is executed on the semiconductor memory device. In Step 12, an erase process is executed on the semiconductor memory device and it is confirmed that all memory cells are erased. In Step 13, an over-erase verification process is executed on a plurality of memory cells of the semiconductor memory device, and one or a plurality of selected memory cells that have not passed the over-erase verification process are recorded, and the total current consumption of the memory cells is detected. In more detail, the over-erase verification process verifies and identifies if there is an over-erased memory cell. The memory cells that have not passed the over-erase verification process are recorded so that the soft program process is executed on these memory cells, and the total current consumption of these memory cells is detected during the verification. For example, when verification of 8 bits at a time is executed in an memory cell array of WL0 to WL255, the total current consumption is equal to $I_{cell} \times 8 + I_{off} \times 255 \times 8$, wherein $I_{cell}$ represents the current consumption of the currently powered memory cells under verification, and $I_{off}$ represents the leakage currents of the other unpowered memory cells (i.e., word lines WL0 to WL255).

Thereafter, in Step 14, the number of the memory cells to be executed with the soft program process is determined according to the total current consumption. In Step 15, the soft program process is executed on the memory cells based on the number of the memory cells. That is, a corresponding number of bit lines on the word lines are turned on based on the determined number of the memory cells, thereby executing the soft program process. For example, when the soft program process is executed by turning on one word line at a time, after the number of the memory cells to be executed with the soft program process is determined as 2, 2 word lines are turned on each time the soft program process is executed, and other cases may be inferred by analogy.

Figure 2:
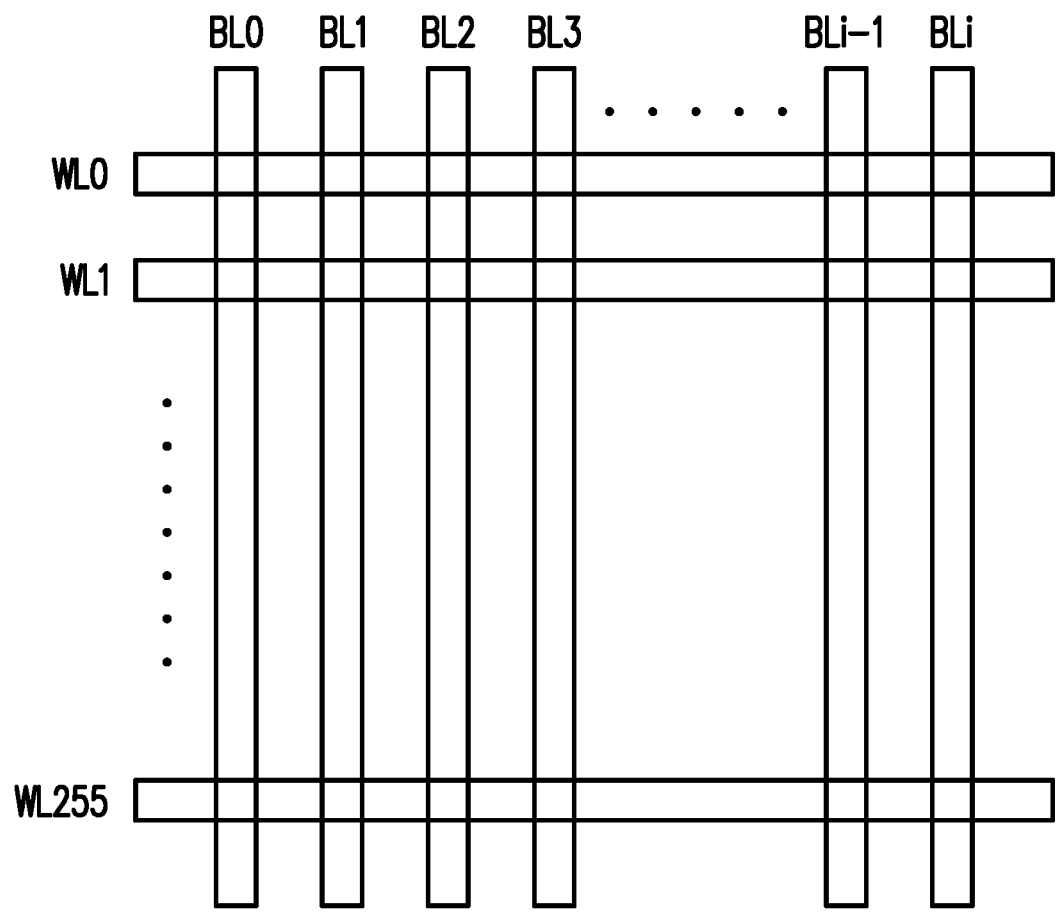
FIG. 2 is a schematic diagram of a memory cell array according to an embodiment of the disclosure.

With reference to FIG. 2, a memory cell array 2 includes 256 word lines and i bit lines. In the embodiment, when the pre-program process and the erase/erase verification process are executed on the memory cell array 2, they are executed on the entire memory cell array, and when the over-erase verification process and the soft program process are executed on the memory cell array 2, they are executed for 8 bits on a word line at a time.

For example, the over-erase verification process is first executed on the memory cells on the word line WL0 and the bit lines BL0 to BL7, and the total current consumption at this time is detected. That is, the word line WL0 and the bit lines BL0 to BL7 are turned on. Then, the number of the memory cells to be executed with the soft program process is determined according to the total current consumption. Thereafter, the soft program process is executed by turning on a corresponding number of the bit lines based on the number of the memory cells.

For example, if the number of the memory cells determined according to the total current consumption is 2, the bit line BL0 and the bit line BL1 (i.e., 2 memory cells) are first turned on in the soft program process to execute the soft program process. After the bit line BL0 and the bit line BL1 on the word line WL0 are completed with the soft program process, the bit line BL2 and the bit line BL3 are then turned on to execute the soft program process. Similarly, two bit lines are turned on at a time to execute the soft program process until the 8 bit lines on the word line WL0 are completed with the soft program process.

Once the bit lines BL0 to BL7 on the word line WL0 have all been completed with the soft program process, the over-erase verification process is executed on the memory cells between the word line WL1 and the bit lines BL0 to BL7, and the total current consumption of these memory cells on the word line WL1 is detected. The number of the memory cells to be executed with the soft program process is determined according to the total current consumption on the word line WL1, and a corresponding number of the bit lines are turned on based on the number of the memory cells to execute the soft program process. Similarly, the over-erase verification process and the soft program process are sequentially executed on each word line until the bit lines BL0 to BL7 on the word line WL255 are all completed with the soft program process. Thereafter, the over-erase verification process and the soft program process are executed on the word lines BL8 to BL15.

Figure 3:
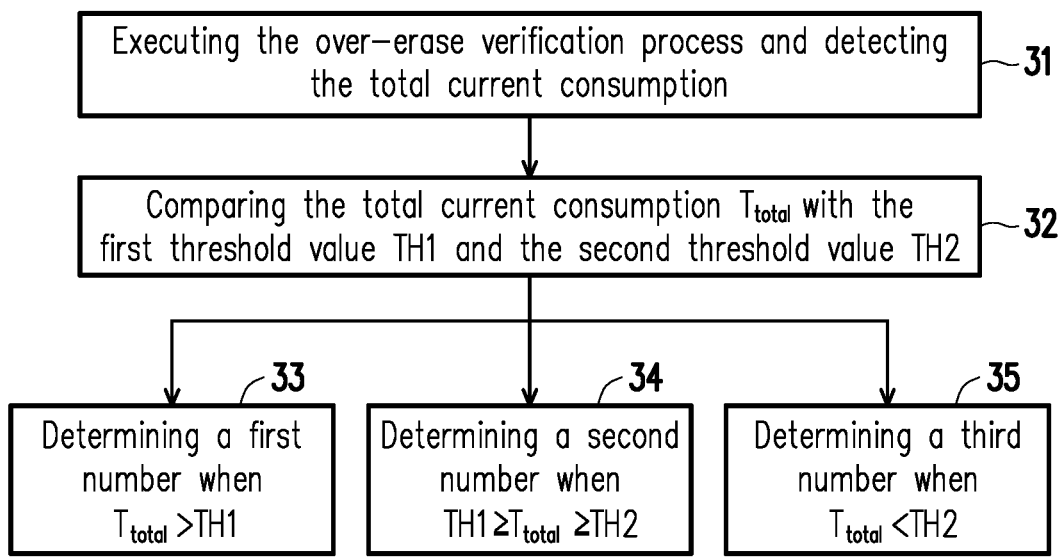
FIG. 3 is another flowchart of the erasing method according to an embodiment of the disclosure.

FIG. 3 shows another embodiment of the disclosure. With reference to FIGS. 2 and 3, in Step 31, the over-erase verification process is executed, and the total current consumption is detected. Here, the action of Step 31 is identical with or similar to that of Step 13; please refer to Step 13 for description, and details are not described herein.

Next, in Step 32, the total current consumption $T_{total}$ is compared with two threshold values (a first threshold value TH1 and a second threshold value TH2). Here, the threshold values are associated with the manufacturing process of the memory device. The embodiment is described with only two threshold values as an example. However, the number of the threshold values is not limited herein.

In Step 33, when the total current consumption $T_{total}$ is greater than the first threshold value TH1, the number of the memory cells is determined as a first number. In Step 34, when the total current consumption $T_{total}$ is less than or equal to the first threshold value TH1 and greater than or equal to the second threshold value TH2, the number of the memory cells is determined as a second number; in Step 35, when the total current consumption $T_{total}$ is less than the second threshold value TH2, the number of the memory cells is determined as a third number, wherein the first number is less than the second number, and the second number is less than the third number. Here, the first number, the second number, and the third number are, for example, powers of two. In the embodiment, the first number is 2, and the second number is 4, and the third number is 8.

In addition, when the over-erase verification process is executed, the number of the selected memory cells that have not passed the verification may be recorded, and the number of the bit lines to be turned on may be determined based thereon. For example, if the number of the selected memory cells is small, it means that the power consumption is small, and more bit lines may be turned on when soft programming is executed. If the number of the selected memory cells is large, it means that the power consumption is large, and fewer bit lines are turned on when soft programming is executed.

As described above, the over-erase verification process and the soft program process are executed on one word line at a time, and the total current consumption of each word line may vary. Therefore, the number of the memory cells to be executed with the soft program process determined by each word may also vary.

It should be noted that since the over-erase verification process and the soft program process are executed only on one word line at a time, each word line in the memory cell array 2 of the memory device determines the number of the memory cells to be executed with the soft program process according to Steps 31 to 35 (i.e. the number of the bit lines to be turned on each time) during the execution of the over-erase verification process. Once the over-erase verification process and the soft program process have been executed on the 8 bit lines on the word line WL0, then the over-erase verification process and the soft program process are executed on the memory cells on the 8 bit lines on the word line WL1 in the same way. Similarly, the over-erase verification process and the soft program process are sequentially executed on each word line until the 8 bit lines on the word line WL255 are all completed with the soft program process. Thereafter, the over-erase verification process and the soft program process are executed on the next group of bit lines (such as bit lines BL8 to BL15).

When all of the memory cells of each word line on the memory cell array 2 of the memory device have been successfully soft-programmed, all the memory cells on the memory cell array 2 of the memory device are refreshed. When all the memory cells have been refreshed, the erasing program is ended.

In summary of the above, the erasing method disclosed in the disclosure verifies which memory cells have to be executed with the soft program process in the over-erase verification process and determines the number of the bit lines required to be turned on in the soft program process based on the total current consumption. If the total current consumption is relatively large, then fewer bit lines (such as 2) are turned on at a time to execute the soft program process. On the other hand, if the total current consumption is relatively small, more bit lines (such as 8) are turned on at a time to execute the soft program process. Therefore, if the number of the memory cells to be executed with the soft program process is adjusted according to the current consumption, the load of the drain charge pump can be effectively balanced, and when the memory chip with a low supply voltage executes the soft program process on the memory cells, the efficiency can be effectively improved. In this way, the efficiency of the soft program process can be improved, and the time for the soft program process can be reduced.

Although the disclosure has been described with reference to the above embodiments, it will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. An erasing method adapted for a semiconductor memory device, comprising: executing a pre-program process on the semiconductor memory device; executing an erase process on the semiconductor memory device; executing an over-erase verification process on a plurality of memory cells of the semiconductor memory device and detecting a total current consumption of the plurality of memory cells; determining the number of the memory cells to be executed with a soft program process according to the total current consumption; executing the soft program process on the memory cells based on the number of the memory cells; wherein a step of determining the number of the memory cells to be executed with the soft program process according to the total current consumption comprises: comparing the total current consumption with a plurality of threshold values to determine the number of the memory cells to be executed with the soft program process.

2. The erasing method according to claim 1, after a step of executing the over-erase verification process on the memory cells, further comprising:
   recording one or a plurality of selected memory cells that have not passed the over-erase verification process.

3. The erasing method according to claim 1, wherein the plurality of threshold values comprises a first threshold value and a second threshold value,
   when the total current consumption is greater than the first threshold value, the number of the memory cells is determined as a first number,
   when the total current consumption is less than or equal to the first threshold value and greater than or equal to the second threshold value, the number of the memory cells is determined as a second number, and
   when the total current consumption is less than the second threshold value, the number of the memory cells is determined as a third number,
   wherein the first number is less than the second number, and the second number is less than the third number.

4. The erasing method according to claim 3, wherein the first number, the second number, and the third number all are powers of two.

5. The erasing method according to claim 1, wherein a step of executing the soft program process on the memory cells based on the number of the memory cells comprises:
   turning on a corresponding number of bit lines based on the number of the memory cells to execute the soft program process.

6. The erasing method according to claim 1, further comprising:
   executing the over-erase verification process and the soft program process on one word line at a time.

7. The erasing method according to claim 1, wherein the semiconductor memory device is a NOR flash memory chip.

8. The erasing method according to claim 1, wherein the total current consumption comprises a sum of leakage currents of word lines.

* * * * *